ELECTRICAL INTERCONNECTION OF MICROMODULE CIRCUIT DEVICES

Filed April 8, 1966 Sheet 1 of 2

INVENTOR.
JOHN PARSTORFER
BY
Harry W. Hargis III
AGENT

INVENTOR.
JOHN PARSTORFER
BY
Harry W. Hargis III
AGENT

United States Patent Office 3,429,788
Patented Feb. 25, 1969

3,429,788

ELECTRICAL INTERCONNECTION OF MICROMODULE CIRCUIT DEVICES

John Parstorfer, Philadelphia, Pa., assignor to Philco-Ford Corporation, Philadelphia, Pa., a corporation of Delaware

Filed Apr. 8, 1966, Ser. No. 541,219
U.S. Cl. 204—30 13 Claims
Int. Cl. H01r *43/00;* H01l *19/00;* C23b *5/58*

This invention relates to a method for effecting electrical interconnection of the terminals of micromodule circuit devices. While of broader applicability, the invention has particular utility in the fabrication of so-called "microblock" assemblies which comprise a plurality of micromodule circuit devices, each of the latter comprising a housing, commonly of the type known as a "flat-pack," from which extend coplanar arrays of oppositely extending terminal wires.

The invention relates more specifically to the potting or encapsulation, in an insulative block, such for example as an epoxy resin, of a plurality of micromodule circuit devices, in which the necessary circuit connections to and between exposed terminal wires of the devices are made by way of metal conductors which are plated, or otherwise deposited, on the surfaces of the insulative block.

The invention has as its principal objective the provision of an improved method enhancing electrical connection of the terminal wires to such plated metal conductors.

The invention has as a further objective the provision of a novel process for encapsulating circuit devices in an insulative block, which process insures excellent adherence of plated conductors not only to the surface of an insulative block, which process ensures excellent adher-the devices and exposed through the walls of the block.

In achievement of the foregoing and other objectives, the invention, in preferred practice thereof, contemplates that the terminal wires extending from a flat-pack housed device be coated with an electrically conductive material, such as a metal, and that the devices be potted in an electrically insulative material. Prior to potting, irregularly shaped particles of a material, preferably also electrically insulative, and capable of being dissolved in a suitable etching solution, are mixed with the potting material, and become embedded therein when the potting material has hardened. Upon completion of potting, surface portions of the hardened resin block through which the terminal wires extend are made smooth, as by sanding, to provide adjacent smooth surfaces comprising potting material, embedded particles, and cross-sections of the terminal wire end portions. These smooth surfaces are then subjected to treatment by an etching solution to dissolve the exposed embedded particles, whereby undercut depressions are obtained in the otherwise relatively smooth surfaces, and to dissolve some of the plating adherent to lateral portions of the exposed terminal wires. Removal of this plating creates a ring-shaped groove or depression around each terminal wire end portion to increase the exposed contact surface areas of the terminal wires, thereby providing for improvement in their subsequent interconnection. It will be appreciated from the foregoing that both the terminal wire coating material and the embedded particles advantageously are capable of being dissolved by the same etching solution. Metal is then plated onto the treated surface, with underlying portions of the plated metal entering the aforementioned ring-shaped grooves and the undercut depressions. The process is completed by applying the desired circuit patterns to the metal plated surfaces of the block, in accordance with conventional methods.

From the foregoing it will be appreciated that the invention is characterized by a novel method for enhancing the bond of plated circuit to surface portions of a nonmetallic insulative material by providing undercuts therein, which method further ensures an adequate stub area for each of a plurality of terminal wires extending to surface portions of the insulative material, whereby a positive grip of plated circuits with the terminal wire stubs may be attained.

The manner in which the foregoing as well as other objectives and advantages of the invention may best be achieved will be understood from a consideration of the following description, taken in light of the accompanying drawings in which.

Figures 1, 2:
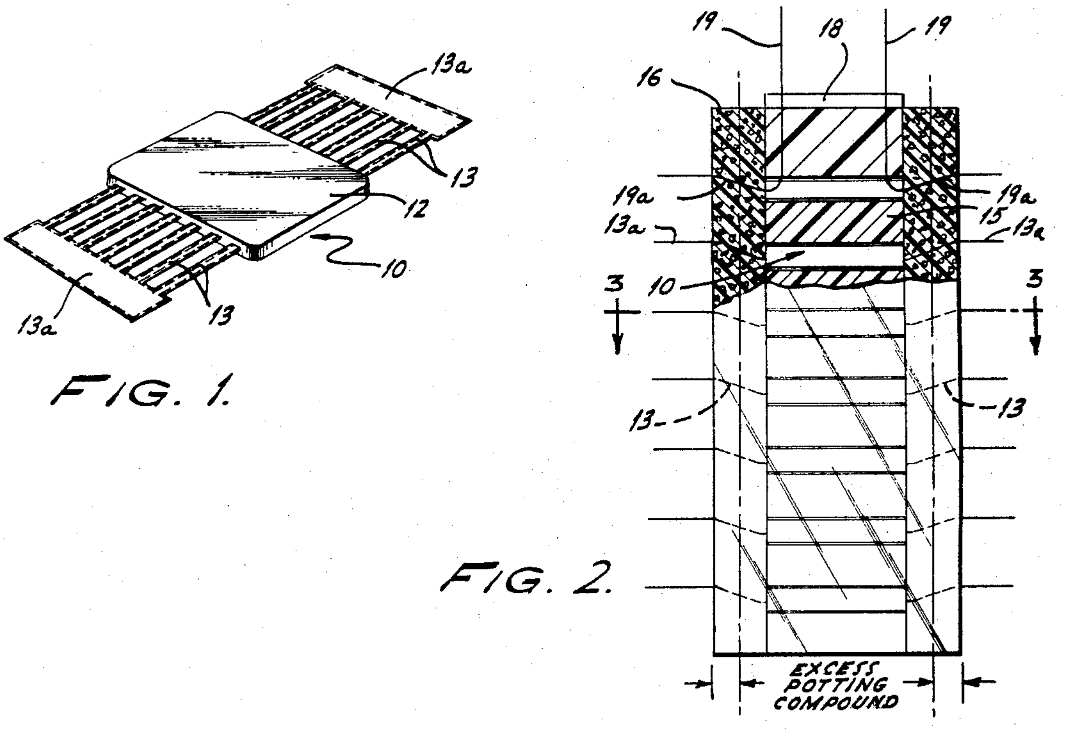
FIGURE 1 is a perspective showing, on a greatly enlarged scale, of a micromodule circuit device of a type particularly well adapted to the manufacture of microblocks in accordance with the invention.
FIGURE 2 is a showing of a step in my novel method of assembling a microblock circuit device from a plurality of such micromodules.
Figures 8, 9:
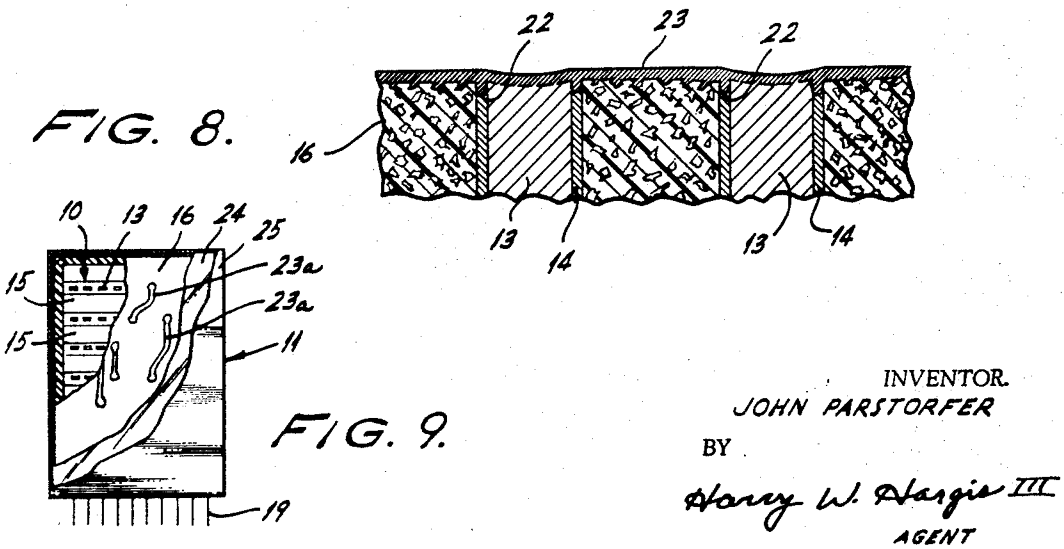
FIGURE 9 is an elevational view, with parts broken away, showing a microblock assembly completed in accordance with the invention and appearing on a much smaller scale than is utilized in FIGURES 5–8.

With more particular reference to the drawings, a typical flat-pack micromodule device 10 is illustrated in FIGURE 1, and is adapted for assembly in a modular block construction such as microblock 11 (FIGURE 9). Device 10 comprises a relatively small rectangular main housing portion 12 enclosing a microcircuit element (not shown). Terminal wires 13 for the enclosed microcircuit element extend in coplanar arrays from opposite sides of the housing (see FIGURE 5), and are of relatively small cross-sectional area. By way of example, dimensions of one known rectangular housing comprise only .250 x .150 x .050 inch, and the terminal wire cross section comprises an area of only 45 square mils (3 mils$\times$15 mils). Due to their relatively small cross-sectional areas, it has been difficult heretofore to make interconnections between the wires, as well as to ensure satisfactory electrical contacts at the connections. Moreover, cross sections of the terminal wires are relatively smooth, which further contributes to difficulties in making good electrical contacts to plated circuit interconnections that may be only 1 mil thick.

In the interest of overcoming the foregoing as well as other problems, and as will be more fully appreciated from the ensuing description, each of terminal wires 13 comprises a gold plated alloy of iron, cobalt, and nickel, upon which has been plated a layer of copper 14, preferably about 1 mil thick as mentioned above. One such alloy suitable for the purposes of the invention is sold under the name "Kovar."

Figure 4:
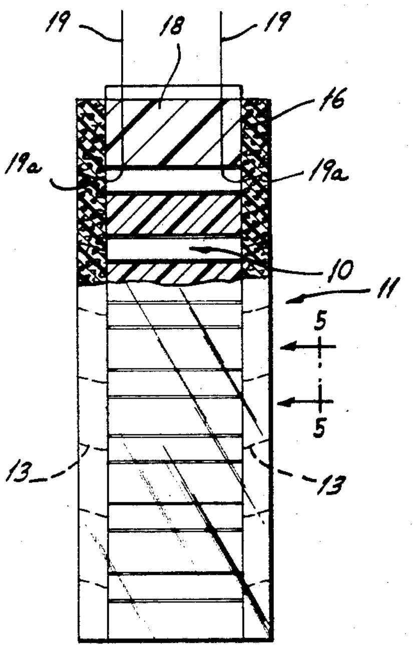
FIGURE 4 is a view similar to FIG. 2 and showing a further step in the method comprising the invention.
Figure 3:
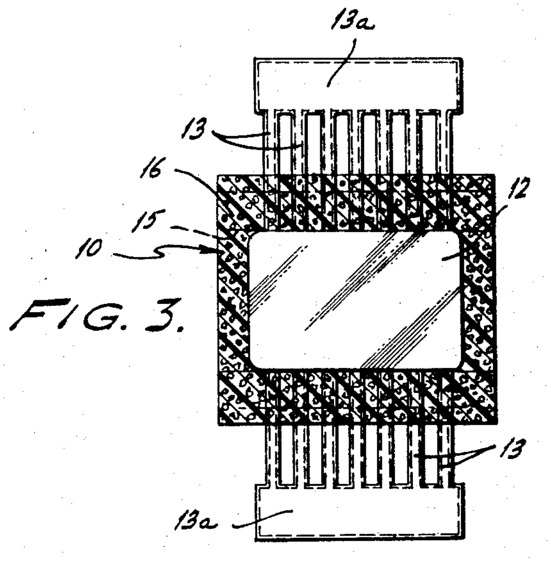
FIGURE 3 is a sectional view taken along the plane indicated by arrows 3—3 applied to FIGURE 2.
Figure 5:
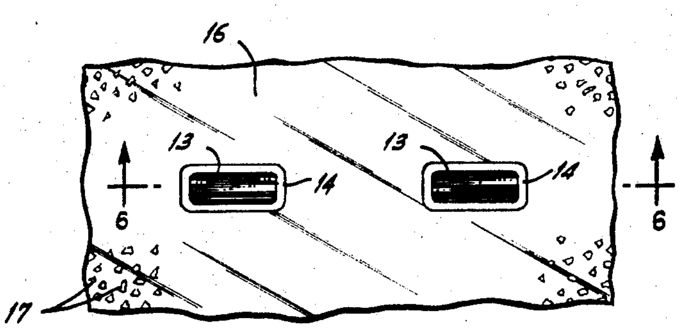
FIGURE 5 is an elevational view on a still further enlarged scale, looking generally in the direction of arrows 5—5 applied to FIGURE 4.

The coating of copper 14 is seen to surround wires 13 in FIGURE 5, and in FIGURES 1 and 3 the outer coating of copper is shown in full lines, and the underlying wires 13 are shown in broken lines. For convenience of illustration only single line showings (both broken and full) of wires 13 are resorted to in FIGURES 2 and 4. For convenience of handling, and in order to maintain substantial parallelism of the terminal wires until the flat-pack device is potted, a strip of material 13*a* (FIGURES 1, 2 and 3) from which the leads have been stamped is left intact. This strip 13*a* is of course removed (FIGURES 4, 5 and 6) in one of the method steps hereinafter to be described, when it is assured that the terminal wires are held in place so that they do not touch one another, thereby avoiding possible short circuits.

With reference to FIGURE 2, a predetermined required number of flat-pack housed devices 10 are stacked alternately with insulative spacers 15, and each stack is provided with an insulative socket base 18 having the microblock terminal wires 19, also copper plated, extending therethrough. As is preferred in assembly of the devices, the stacks are inverted as shown in FIGURES 2 and 4. Each flat-pack device is so positioned that the copper coated terminal wires 13 is disposed to either side of the device are substantially parallel and extend in the same direction. The socket base 18 also is so positioned that portions 19*a* of its terminal wires are parallel and generally coextensive with wires 13. The stacked devices 10 and their socket base 18 are then potted in an epoxy compound 16, e.g., resin or other suitable electrically insulative material, to which previously has been added a filler of copper oxide powder 17. Preferably, the wires 13 are angled slightly upwardly as shown in order that any pockets of entrapped gas, such as air, in the uncured resin will tend to flow upwardly along the angled leads. In flowing upwardly, such pockets will move toward the surface of the block subsequently to be removed, as will be described. It is preferred to use an oxide of a grain size such as will pass a screen of approximately 200 meshes per lineal inch, and thoroughly mixed with the resin in proportions of approximately 50% to 60% by weight as respects the weight of the potting compound 16. It will of course be understood that other techniques may be used for applying the particles to the epoxy resin. For example, the particles may be applied as thin layers by spraying or screening prior to curing or hardening of the resin, on the surfaces of the latter through which the terminal wires extend.

Figure 6:
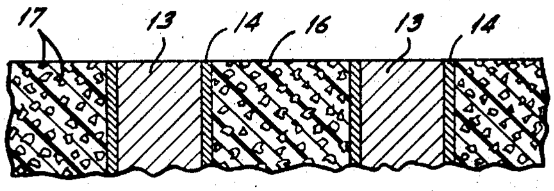
FIGURE 6 is a sectional view taken as indicated by arrows 6—6 applied to FIGURE 5.
Figure 7:
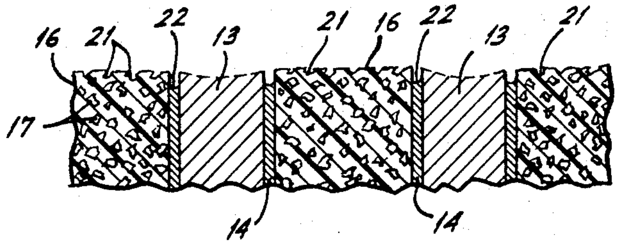
FIGURES 7 and 8 are sectional views similar to FIGURE 6, and illustrating further steps in the assembly of a microblock according to the invention.

After devices 10 have been potted, and as best seen in FIGURES 4, 5 and 6, terminal wires 13 and their interconnecting strips 13*a* are trimmed, and surface portions of resin 16 through which terminal wires 13 and 19*a* extend are made flat, as by sanding, to expose the embedded copper oxide grains or particles 17. With reference to FIGURE 2, the excess potting compound which is to be removed is included in the zones included by arrows applied to the lower portion of the figure. Also exposed by the sanding operation are cross sections of the copper and gold plated Kovar terminal wires 13 and 19*a*. The above described sanded surface portions (FIGURES 5 and 6) are then subject to an etching process, preferably comprising spraying of said surfaces with an etchant that will attack the copper oxide particles, but will not adversely affect the resinous material. Aqueous solutions of hydrochloric acid or ammonium persulphate have been found suitable as etchants in carrying out the present invention. Etching dissolves exposed particles 17, leaving large quantities of tiny, undercut depressions 21 (FIGURE 7) in the surface of the epoxy resin block.

Copper oxide is preferred because it does not contaminate the etching solution, and because of its electrical insulating characteristics. A metallic copper powder would be suitable also, in case it were desired to improve thermal conduction characteristics of the microblock, while only slightly affecting the electrical insulating characteristics. It is especially a feature of the invention that etching also removes some of the plated copper 14 on terminal wires 13, and 19*a*, creating a ring-shaped groove 22 (FIGURES 7 and 8) surrounding each terminal wire to form a terminal wire stub. Since plating of the terminal wires increases their cross-sectional area by a substantial factor, the ring-shaped groove 22 is of relatively large size as compared with the exposed terminal wire stub. The effect of groove 22 is, therefore, to create a terminal wire stub portion having its exposed cross-section only slightly attacked by the etching solution and its sides protected by the gold plating (not shown) that underlies the etched copper plating.

After treatment with the etching solution, and with reference to FIGURE 8, a layer of copper 23 is plated upon the treated surface portions. This plating of copper 23 is essentially a two-step process comprising deposition of a first layer by known electroless plating techniques, followed by deposition of an outer layer by known electroplating techniques. Advantageously, copper plated by the electroless method penetrates the undercut depressions 21 and ring-shaped grooves 22, thereby establishing a relatively strong bond for the remainder of the copper layer deposited by electroplating methods.

An etch resist defining the desired interconnecting circuit pattern is screened onto the copper layer 23, the desired circuit pattern is etched onto the block, and the resist is removed from the pattern, all in accordance with conventional printed circuit techniques. Portions of such circuits are designated by the numeral 23*a* in FIGURE 9.

While not required for an understanding of the present invention, it will be appreciated that additional layers of circuits may be applied over the first layer, also in accordance with known techniques.

As illustrated in FIGURE 9, an electrically insulative protective coating 24 is placed over the exposed, outermost circuit pattern and the assembly is sealed in a further protective metallic case or shield 25, which also can be applied to the insulative coating using the hereinabove described electroless and electroplating techniques. The microblock is then ready for use.

It will of course be understood that the present microblock is only illustrative of devices to which the invention is applicable, and that the modular construction may take other forms. For example, any convenient number of flat-pack devices may be encapsulated in a single block. Also, the terminal wires may extend only from one side of an individual device, and these wires may take a variety of shapes. Also, my invention is not limited to use of the preferred materials described above. For example coatings other than copper, and particles other than copper oxide and copper may be used, and the etching solution may be varied accordingly.

The foregoing as well as other modifications are contemplated by the scope of the appended claims.

I claim:

1. A method for making electrical connections to the terminal wires of integrated circuit devices, comprising the steps of: providing such devices with terminal wires extending from at least one side thereof; plating said wires with a metal capable of being removed by a suitable etchant; assembling a plurality of said devices so that terminal wires extend substantially unidirectionally; encapsulating the assembly in an electrically insulative material having interspersed therein particles of a material capable of being dissolved by the etchant, to form a body having terminal wires protruding therefrom; smoothing the side of the insulative block encapsulating the protruding terminal wires so that the terminal wires and the metal plated thereon are exposed in cross-section, and to expose portions of the embedded particles at the smooth surface; etching the exposed particles and portions of the recited plated metal; and electrically interconnecting the exposed terminal wire portions by applying the desired interconnection pattern upon the etched side of the insulative block and across the exposed portions of the terminal wires.

2. The method according to claim 1, and characterized in that the plating applied to said wires comprises copper, said particles comprise copper oxide, and said etchant comprises a solution selected from the group consisting of hydrochloric acid and ammonium persulphate.

3. The method according to claim 1, and characterized in that said last recited step comprises; plating a layer of metal upon the etched side of said insulative block and upon the exposed portions of the terminal wires;

depositing on said layer of metal an etch resist defining the desired terminal wire interconnection pattern; and etching away the exposed portions of the layer of metal to form the desired interconnection pattern.

4. The method according to claim 1, and characterized in that said particles of material are interspersed in at least portions of the insulative material through which the terminal wires extend.

5. The method according to claim 4, and further characterized in that etching of said metal plated on said exposed wire portions is effective to form a ring about each said portion, into which ring the applied circuits are received for connecting to said wire portions.

6. The method according to claim 3, and further characterized in that plating said layer of metal comprises the steps of depositing a first layer of metal on the etched side of said block by electroless plating techniques followed by depositing a second layer of metal on the first layer of metal by electroplating techniques.

7. A method for electrically interconnecting the terminal wires of micromodule circuit devices, comprising the steps of: providing devices with terminal wires extending from at least one side thereof; plating said wires with a metal capable of being removed by a suitable etchant; stacking said devices so that the terminal wires to be interconnected are spaced from one another along their lengths; encapsulating the stacked assembly in a resin having interspersed therein particles of a material capable of being dissolved by the etchant, to form a resin block with the terminal wires protruding therefrom; finishing the side of the resin block containing the protruding terminal wires so that the terminal wires, and the metal plated thereon, are exposed in cross-section, and to expose portions of embedded particles; treating said side of the block with an etchant to dissolve the exposed particles of soluble material and portions of the recited plated metal; and electrically interconnecting exposed wire cross-sections, in accordance with the desired interconnection pattern, by applying circuits to the etched side and to wire cross sections by printed circuit techniques.

8. The method according to claim 7, and characterized in that said last recited step comprises: plating a layer of metal upon said etched side, upon said wire cross section, and upon portions of said wires from which metal has been removed; depositing an etch resist defining the desired interconnection pattern to the layer of metal; and etching away the exposed portions of the layer of metal to form the desired interconnection pattern.

9. The method according to claim 7, in which said resin comprises an epoxy resin and said particles comprise granules of copper oxide.

10. The method according to claim 8, and further characterized in that plating said layer of metal comprises the steps of depositing a first layer of metal on the etched side of said block by electroless plating techniques followed by depositing a second layer of metal on the first layer by electroplating techniques.

11. A method for making electrical connections to the terminal wires of an integrated circuit device, comprising the steps of: providing such a device with terminal wires coated with a highly conductive etchable metal and extending from said device into an electrically insulative body encapsulating the device; removing material from said body and said wires so that said wires are exposed in cross-section in a surface of said body; providing reentrant depressions around the wires recessed below the surface of said body, by subjecting said wires to an etchant to remove some of the plating adherent to the lateral portions of the exposed ends of the wires; and plating metal across the surface of portions of said insulative body and across the exposed ends of at least certain of said wires, said plated metal entering said depressions and bonding with the metal coating of the terminal wires.

12. The method according to claim 11, and further characterized by the step of interspersing in said electrically insulative body particles of material capable of being dissolved upon the step of subjecting said wires to said etchant, to provide undercut depressions in the surface of said body.

13. The method according to claim 12 and characterized in that said step of plating metal comprises depositing a first layer of metal on surface portions of said insulative body by electroless plating techniques, followed by depositing a second layer of metal on the first layer of metal by electroplating techniques.

References Cited

UNITED STATES PATENTS

| | | | |
|---|---|---|---|
| 1,954,403 | 4/1934 | Daly | 204—15 XR |
| 2,666,694 | 1/1954 | Battersby | 156—2 XR |
| 2,921,246 | 1/1960 | Peck et al. | 317—260 |
| 2,944,917 | 7/1960 | Cahne | 117—49 |
| 3,029,495 | 4/1962 | Doctor | 29—627 |
| 3,116,170 | 12/1963 | Williams et al. | 136—86 |
| 3,222,218 | 12/1965 | Beltzer et al. | 117—213 |
| 3,235,473 | 2/1966 | Le Duc | 204—30 |
| 3,305,460 | 2/1967 | Lacy | 204—20 |
| 3,316,133 | 4/1967 | Shirn et al. | 156—2 |

ROBERT K. MIHALEK, *Primary Examiner.*

W. VAN SISE, *Assistant Examiner.*

U.S. Cl. X.R.

204—16, 20, 38; 117—47, 213, 227; 29—627; 156—2